United States Patent [19]
Saito

[11] Patent Number: 5,081,653
[45] Date of Patent: Jan. 14, 1992

[54] AUTOMATIC GAIN CONTROL CIRCUIT FOR MULTILEVEL DUOBINARY AM/PSK MODULATED SIGNALS

[75] Inventor: Toshio Saito, Tokyo, Japan
[73] Assignee: NEC Corporation, Tokyo, Japan
[21] Appl. No.: 232,946
[22] Filed: Aug. 17, 1988
[30] Foreign Application Priority Data
Aug. 18, 1987 [JP] Japan .................. 62-203445
[51] Int. Cl.$^5$ ......................................... H04L 27/08
[52] U.S. Cl. .............................. 375/98; 455/245; 328/168
[58] Field of Search ............ 375/17, 98, 111, 114; 455/245, 250, 251, 256; 364/480, 571; 328/168; 307/264

[56] References Cited
U.S. PATENT DOCUMENTS

| | | | |
|---|---|---|---|
| 3,409,834 | 11/1968 | Cullis et al. | 375/98 |
| 3,620,631 | 11/1971 | Stopka | 455/244 |
| 3,936,599 | 2/1976 | Peil et al. | 375/98 |
| 4,453,258 | 6/1984 | Richardson | 375/98 |
| 4,458,355 | 7/1984 | Motley et al. | 375/98 |
| 4,464,723 | 8/1984 | Chartier | 364/571 |
| 4,539,692 | 9/1985 | Munter | 364/571 |
| 4,574,246 | 3/1986 | Yoshida | 455/245 |
| 4,597,089 | 6/1986 | Motley et al. | 375/13 |
| 4,691,377 | 9/1987 | Yoshihara et al. | 455/256 |
| 4,707,730 | 11/1987 | Alard | 375/98 |
| 4,757,502 | 7/1988 | Meuriche et al. | 375/98 |
| 4,807,248 | 2/1989 | Pyatt et al. | 375/114 |

OTHER PUBLICATIONS
IEEE 802.4, "Token Passing Bus Access Method and Physical Layer Specifications", Draft H—Aug. 1987, pp. 45–47, 80, 208–209, and 213–215.

*Primary Examiner*—Stephen Chin
*Attorney, Agent, or Firm*—Foley & Lardner

[57] ABSTRACT

An automatic gain control circuit for multilevel duobinary AM/PSK (amplitude modulation/phase shift keying) signals allows multilevel modulated signals to be received accurately. The circuit includes an amplifier that is controlled such that during a preamble section the amplifier has a gain associated with the level of the inputted signal. During a data section the amplifier is controlled to maintain a substantially constant gain. The invention may be used in the reception of AM/PSK modulated signals.

5 Claims, 3 Drawing Sheets

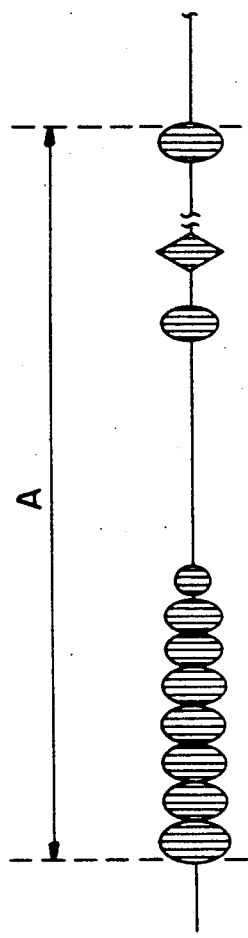
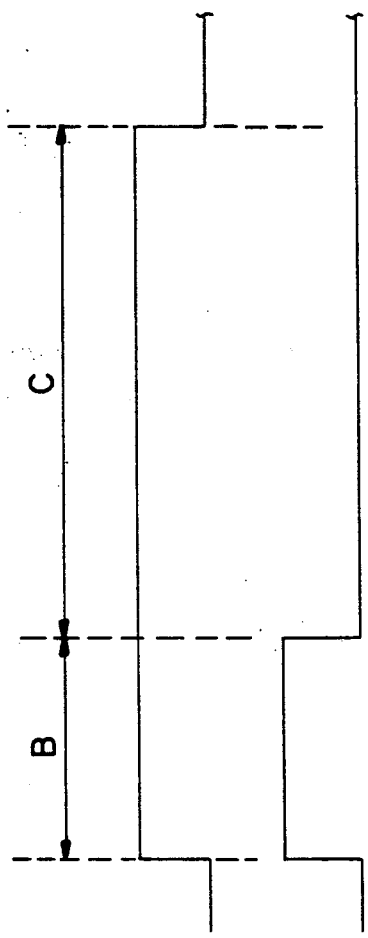
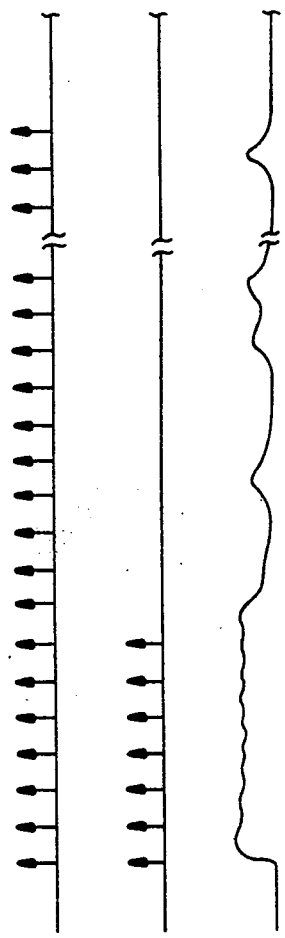
Fig. 2A Fig. 2B Fig. 2C Fig. 2D Fig. 2E Fig. 2F

AUTOMATIC GAIN CONTROL CIRCUIT FOR MULTILEVEL DUOBINARY AM/PSK MODULATED SIGNALS

BACKGROUND OF THE INVENTION

The present invention relates to an automatic gain control circuit used for the reception of multilevel duobinary AM/PSK (amplitude modulation/phase shift keying) modulated signals in the form of bursts as defined by IEEE 802.4 Draft H, August, 1987.

According to the Draft H, three levels, i.e. levels 0, 2 and 4, are defined for a multilevel. Data are transmitted in a frame format which consists of a preamble used to regenerate clock pulses and acquire a signal level, a start delimiter indicative of the beginning of the frame, a data section, and an end delimiter indicative of the end of the frame. While the preamble is constituted of a repetitive pattern of levels 4 and 0, the start and end delimiters are constituted a the combination of levels 0 and 2.

When a receiver with a prior art automatic gain control circuit is applied to such multilevel modulated signals in the form of bursts, there arises a problem that the receiver is incapable of accurately demodulating multilevel modulated signals because the operation of the automatic gain control circuit is too slow. More specifically, when receiving a multilevel modulated signal, prior art automatic gain control circuits operate to maintain amplitude level 4 constant first, on the basis of amplitude level 4 of a preamble. Then, in response to a start delimiter which includes levels 0 and 2, the circuit tends to operate to maintain levels 0 and 2 constant based on the levels 0 and 2, respectively. However, since the operation of the circuit is slow as mentioned above, the circuit soon fails to output the levels 2 and 4 accurately. As a result, the receiver becomes unable to identify the start delimiter and therefore data which will follow the start delimiter becomes inaccurate.

SUMMARY OF THE INVENTION

It is therefore an object of the present invention to provide an automatic gain control circuit which eliminates the drawbacks of to the prior art circuit as described above and which allows multilevel modulated signals to be received with accuracy.

An automatic gain control circuit according to the present invention includes an amplifier for amplifying a multilevel modulated signal in the form of a burst having a preamble pattern in response to a gain control signal which is fed to the amplifier from an integrator. A low-pass filter filters an output signal of the amplifier to produce a filtered signal. A clock regenerator regenerates a clock component out of the modulated signal to produce a clock signal. A circuit produces from the modulated signal a preamble indication signal indicative of a section over which the preamble continues. A sampling clock generator produces a sampling clock pulse in response to the preamble signal and the clock signal. A sample and hold circuit samples the filtered signal in response to the sampling clock signal to produce a sampled signal. An integrator integrates a sampled output of the sample and hold circuit in response to the preamble indication signal to produce the gain control signal.

BRIEF DESCRIPTION OF THE DRAWINGS

The above and other objects, features and advantages of the present invention will become more apparent from the following detailed description taken in conjunction with the accompanying drawings in which:

FIGS. 2A to 2F are timing charts useful for understanding the operation of the circuit shown in FIG. 1.

DESCRIPTION OF THE PREFERRED EMBODIMENT

Figure 1:
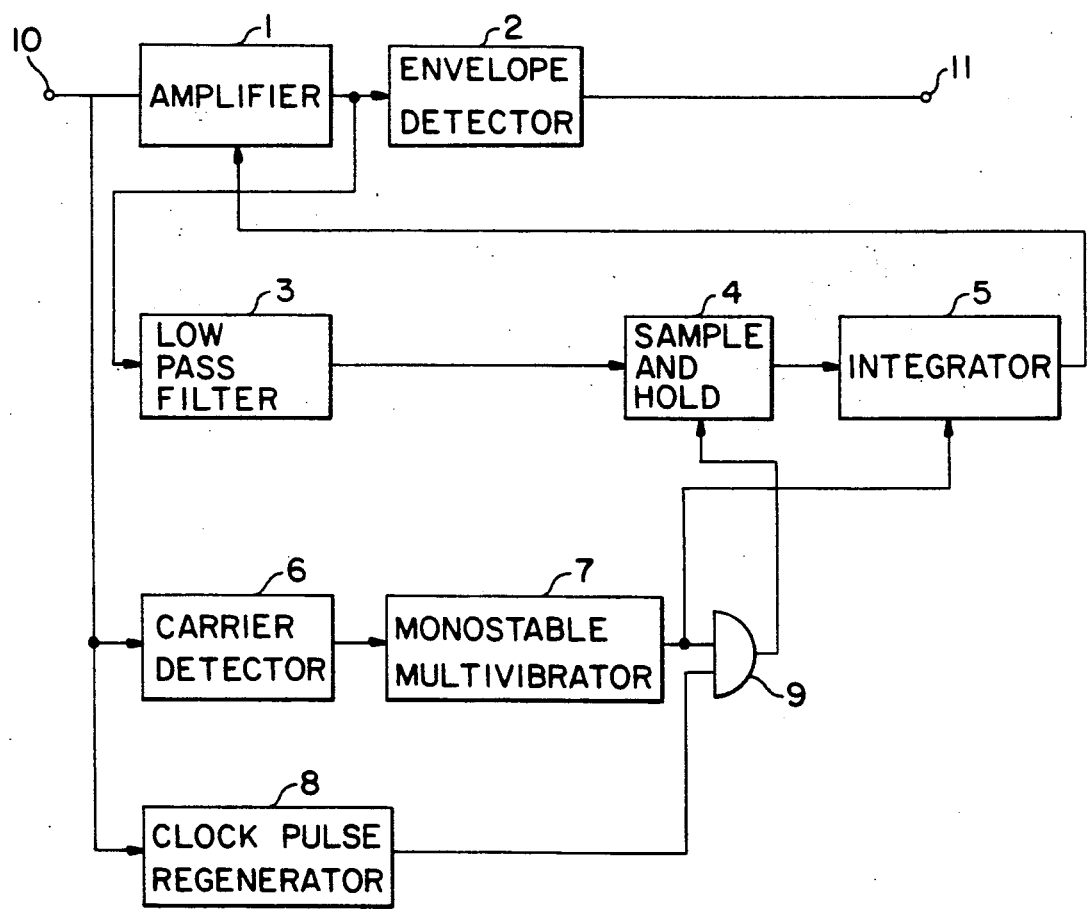
FIG. 1 is a block diagram schematically showing an automatic gain control circuit embodying the present invention.

Referring to FIG. 1, an automatic gain control circuit in accordance with the present invention is shown and includes an input terminal 10 to which a multilevel modulated signal is applied. The modulated signal coming in through the input terminal 10 is fed to a variable-gain amplifier 1, a carrier detector 6, and a clock pulse regenerator 8 adapted to regenerate bit clock pulses. The amplifier 1 amplifies the modulated signal in response to a gain control signal which is applied thereto from an integrator 5 which will be described, thereby producing an amplified multilevel signal. An envelope detector 2 detects the amplified multilevel signal to deliver the detected output to a receiving circuit (not shown) via an output terminal 11. The clock pulse regenerator 8 and the carrier detector 6 respectively detect a clock signal or pulse and a carrier signal out of the input modulated signal. A low-pass filter (LPF) 3 removes high frequency components from the amplified multilevel signal to produce a filtered signal. A monostable multivibrator (MM) 7 responds to a carrier signal detection output from the carrier detector 6 to feed an AND gate 9 and the integrator 5 a preamble indication signal which is representative of a preamble section having a predetermined time width. The gate 9 generates sampling pulses on the basis of the preamble indication signal and clock signal. A sample and hold (S/H) circuit samples the filtered signal from the LPF 3 in response to the sampling pulses, delivering a sampled signal to the integrator 5. Integrating the sampled signal, the integrator 5 feeds its output to the amplifier 1 as a gain control signal. The clock pulse regenerator 8 may be implemented by an LC tank circuit by way of example.

Figure 3:
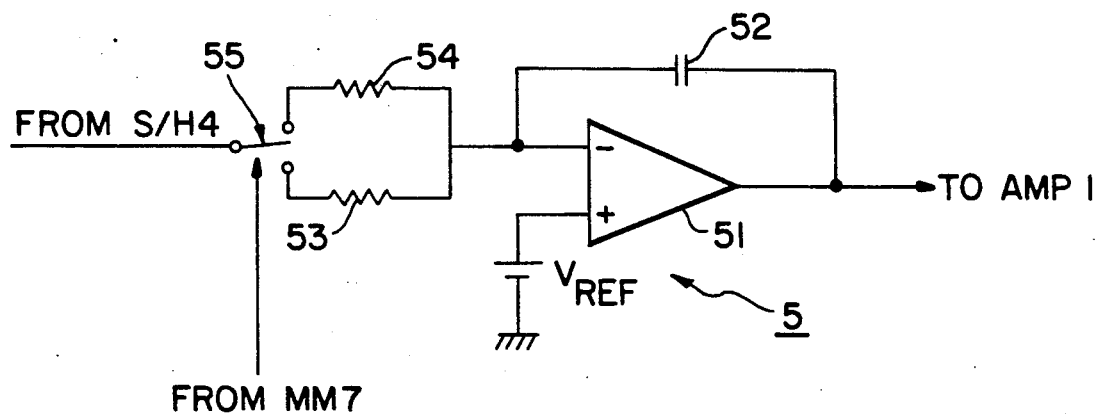
FIGS. 3 and 4 are circuit diagrams each showing a specific construction of a different section of the circuit of FIG. 1.

Referring to FIG. 3, a specific construction of the integrator 5 is shown. As shown, the integrator 5 includes an operational amplifier (OP AMP) 51, and a capacitor 52 and a resistor 53 which cooperate to determine a first time constant of the integrator. The integrator 5 further includes a switch 55 actuated by the preamble indication signal from the MM 7, and a resistor 54 which cooperates with the capacitor 52 to determine a second time constant which is larger than the first time constant. In the illustrative construction, the switch 55 is operated to select the resistor 53 and thereby the first time constant when the output of the MM 7 has a (logical) high level.

If the sampled level is less than a reference voltage $V_{REF}$, the integrator produces a gain control signal to increase the sampled level. Meanwhile, if the sampled level is greater than the voltage $V_{REF}$, the integrator produces a gain control to reduce the sampled level.

Figure 4:
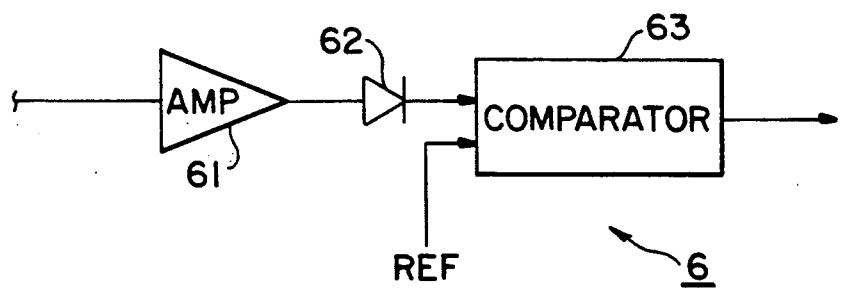

FIG. 4 shows a specific construction of the carrier detector 6. The carrier detector 6 is shown as comprising a tuning amplifier 61 for amplifying only a signal which lies in a predetermined frequency band width of the input modulated signal, a diode 62 for rectifying the amplified signal, and a comparator 63 for generating one of two levels when the rectified output is greater than a reference value.

The operation of the automatic gain control circuit shown in FIG. 1 will be described with reference to FIGS. 2A to 2F.

The multilevel modulated signal applied to the input terminal 10 is routed to the output terminal 11 via the amplifier 1 and envelope detector 2 in the form of a detected output. In FIG. 2A, symbols A, B and C are respectively representative of a single burst or frame, a preamble, and a data section including a start and an end delimiter. The clock regenerator 8 and the carrier detector 6 respectively produce a signal indicative of bit clock pulses (FIG. 2D) and a carrier section signal indicative of the duration of the burst signal (FIG. 2B), the bit clock pulse and carrier frequency being included in the modulated signal as long as the burst continues. At the positive-going edge of the output of the carrier detector 6, i.e., the carrier section signal, the MM 7 produces a preamble indication signal (FIG. 2C) having a predetermined time width which is associated with the preamble section. The output of the LPF 3 (FIG. 2F) is sampled and held by the S/H circuit 4 in synchronism with the clock pulse (FIG. 2E) for the duration of the preamble indication signal. The output of the sample and hold circuit 4 is integrated by the integrator 5 and is then fed back to the amplifier 1 to serve as a gain control signal. The integrator 5 is controlled so as to assume the smaller time constant when the preamble indication signal has a high level and the larger time constant when the preamble indication signal has a low level.

In summary, in accordance with the present invention, the amplifier 1 is controlled such that during the preamble section B it has a gain which is associated with the level of the input modulated signal and, during the following data section C, it maintains a substantially constant gain due to a large time constant even though the level of the input signal may vary to 0, 2 and 4. Hence, a receiver to which the present invention is applied is capable of accurately identifying multilevel modulated signals.

What is claimed is:

1. An automatic gain control circuit comprising:
    amplifier means for amplifying a multilevel modulated signal in the form of a burst, having a preamble pattern, in response to a gain control signal which is fed to said amplifier means from an integrator;
    filter means for low-pass filtering an output signal of said amplifier means to produce a filtered signal;
    clock regenerator means for regenerating a clock component out of a multilevel modulated signal to produce a clock signal;
    means for producing from said multilevel modulated signal a preamble indication signal indicative of a section over which said preamble continues;
    sampling clock generator means for producing sampling clock pulses in response to said preamble indication signal and said clock signal; and
    sample and hold means for sampling said filtered signal in response to said sampling clock pulses to produce a sampled signal; and wherein
    said integrator integrates said sampled signal of said sample and hold means in response to said preamble indication signal to produce said gain control signal.

2. An automatic gain control circuit as claimed in claim 1, wherein said integrator comprises: an operational amplifier; an integrating capacitor connected to an output and to a first input of said operational amplifier; a first and a second resistor connected to said first input of said operational amplifier; and a switch for selectively connecting said first resistor or said second resistor to said first input of said operational amplifier in response to said preamble indication signal.

3. A method of amplifying a multilevel signal comprising the steps of:
    inputting an inputted multilevel signal;
    filtering the inputted multilevel signal with a low pass filter to produce a second signal;
    regenerating a clock component of the inputted multilevel signal and outputting a regenerated signal as a third signal;
    determining a preamble portion of the inputted multilevel signal and outputting a fourth signal corresponding to the preamble portion;
    generating a fifth signal indicating when regenerated clock pulses occur during the preamble portion using the third and fourth signals;
    sampling the second signal in response to the fifth signal to generate sixth signal;
    integrating the sixth signal; and
    controlling the gain of an amplifier using the sixth signal.

4. A method of amplifying a multilevel signal as set forth in claim 3, wherein:
    during the preamble portion, the gain of the amplifier is controlled such that the amplifier has a gain associated with a level of the inputted multilevel signal; and
    following the preamble portion the gain of the amplifier is essentially constant.

5. An amplifying circuit for amplifying an inputted multilevel signal, the inputted multilevel signal including a preamble portion and a non-preamble portion, the amplifying circuit comprising:
    an amplifier; and
    an integrator whose output controls the gain of the amplifier; and wherein:
    the integrator controls the gain of the amplifier on the basis of samples of an amplifier output; and
    the integrator uses one time constant during the preamble portion and another time constant during the non-preamble portion.

* * * * *